US007010185B2

(12) United States Patent
Grubb et al.

(10) Patent No.: US 7,010,185 B2
(45) Date of Patent: Mar. 7, 2006

(54) METHOD OF PROVIDING A LOW COST SEMICONDUCTOR TRANSMITTER PHOTONIC INTEGRATED CIRCUIT (TXPIC) CHIP

(75) Inventors: Stephen G. Grubb, Ellicott City, MD (US); Matthew L. Mitchell, Sunnyvale, CA (US); Robert B. Taylor, Windsor Mill, MD (US); Ting-Kuang Chiang, Saratoga, CA (US); Vincent G. Dominic, Fremont, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 10/887,632

(22) Filed: Jul. 9, 2004

(65) Prior Publication Data

US 2004/0247233 A1 Dec. 9, 2004

Related U.S. Application Data

(62) Division of application No. 10/285,936, filed on Oct. 31, 2002.

(60) Provisional application No. 60/346,044, filed on Nov. 6, 2001.

(51) Int. Cl.
*G02B 6/12* (2006.01)
(52) U.S. Cl. .............................. 385/14; 398/91; 372/26; 372/32
(58) Field of Classification Search .................. 385/14, 385/24, 2, 3, 8, 9, 10, 31, 33, 34, 37, 46; 372/26, 20, 32, 50; 398/91, 1, 9, 87, 79, 398/196, 42
See application file for complete search history.

(56) References Cited

U.S. PATENT DOCUMENTS 5,394,489 A * 2/1995 Koch ........................ 385/14

(Continued)

FOREIGN PATENT DOCUMENTS

EP 0636908 A 2/1995

OTHER PUBLICATIONS

M. G. Young et al., "A 16×1 WDM Transmitter with Integrated DBR Lasers and Electroabsorption Modulators", *Integrated Photonics Research*, Washington, D.C., vol. 10, pp. 414-417, Mar. 22-24, 1993, Palm Springs, CA, US.

(Continued)

*Primary Examiner*—Frank G. Font
*Assistant Examiner*—James P. Hughes
(74) *Attorney, Agent, or Firm*—W. Douglas Carothers, Jr.

(57) ABSTRACT

A method of deploying a passive optical combiner that is a broad bandwidth spectral wavelength combiner for combining the outputs from multiples transmitter photonic integrated circuit (TxPIC) chips and, thereafter, the amplification of the combined channel signals with a booster optical amplifier couple between the passive optical combiner and the fiber transmission link. The booster optical amplifier may be a rear earth fiber amplifier, such as an erbium doped fiber amplifier (EDFA), or one or more semiconductor optical amplifiers (SOAs) on one or more semiconductor chips. Such a combination of optical components simplifies the design of individual TxPICs and other such optical communication PICs, which has to take into consideration the nonlinear effects of difficult, high loss single mode fiber (SMF) links or other fiber-type links by allowing a higher power per channel to be achieved compared to the case where channel amplification is attempted directly on the TxPIC chip through the deployment of on-chip optical amplifiers, such as semiconductor optical amplifiers (SOAs), integrated in locations following the electro-optic (EO) modulators, if not integrated also at other locations on the same chip.

9 Claims, 5 Drawing Sheets

U.S. PATENT DOCUMENTS

| | | | |
|---|---|---|---|
| 5,745,613 A * | 4/1998 | Fukuchi et al. | 385/24 |
| 5,960,141 A * | 9/1999 | Sasaki et al. | 385/88 |
| 5,987,050 A * | 11/1999 | Doerr et al. | 372/108 |
| 6,192,170 B1 * | 2/2001 | Komatsu | 385/15 |
| 6,236,771 B1 * | 5/2001 | Aoki et al. | 385/2 |
| 6,271,947 B1 * | 8/2001 | Iannone et al. | 398/9 |
| 6,275,317 B1 | 8/2001 | Doerr et al. | |
| 6,542,268 B1 * | 4/2003 | Rotolo et al. | 398/7 |
| 6,700,517 B1 * | 3/2004 | Kellar | 398/101 |

OTHER PUBLICATIONS

E. Suhir, "The Future of Microelectronics and Photonics and the Role of Mechanics and Materials", *IEEE/CPMT Electronic Packing Technology Conference, 1997*, Proceedings of 1997 Conference, pp. 18-28, 1ST Singapore, Oct. 8-10, 1997, and IEEE in 1997, New York, NY, US.

U. Koren et al., "Photonic Integrated Circuits for Telecommunication—Present Status and Future Trends—", *Japanese Journal of Applied Physics, Extended Abstracts $22^{ND}$ Conference on Solid State Devices and Materials*, pp. 773-775, 1990, Tokyo, JP.

Minoru Maeda et al., "Photonic Integrated Circuit Combining two GaAs Distributed Bragg Reflector laser Diodes for Generation of the Beat Signal", *Japanese Journal of Applied Physics*, vol. 31(2B), pp. L183-L185, Feb. 15, 1992, Tokyo, JP.

Koji Kudo et al., "1.55-mm Wavelength-Selectable Microarray DFB-LD's with Integrated MMI Combiner, SOA, and EA-Modulator", *Optical Fiber Conference (OFC)*, Technical Digest Post Conference Addition, vol. 1 of 4, pp. 190-192, Mar. 7-10, 2000, Baltimore, MD, US.

* cited by examiner

METHOD OF PROVIDING A LOW COST SEMICONDUCTOR TRANSMITTER PHOTONIC INTEGRATED CIRCUIT (TXPIC) CHIP

CROSS-REFERENCE TO RELATED APPLICATION

This application is a division of U.S. patent application Ser. No. 10/285,936, filed Oct. 31, 2002 which claims priority of U.S. provisional application Ser. No. 60/346,044, filed Nov. 6, 2001, which applications are incorporated herein by its reference.

BACKGROUND OF THE INVENTION

Field of the Invention

This invention relates generally to optical telecommunication modules which include one or more photonic integrated circuit (PIC) chips and more particularly to the method of deploying one or more of such PIC chips with an off-chip booster optical amplifier to boost the multiplexed channel signal output of the chip or chips.

Semiconductor photonic integrated circuit (PIC) chip architecture has recently been developed at Infinera Corporation comprising multiple transmitter or receiver channels, or both, formed on a single semiconductor chip optically coupled with an optical combiner which provides an off-chip output of plural multiplexed channel signals. This architecture includes one or more photonic integrated circuits (PICs) on a single chip, such as an InP chip using, for example, InGaAsP/InP or InAlGaAs/InP alloys. These monolithic chips are called transmitter photonic integrated circuits (TxPICs) or receiver photonic integrated circuits (RxPICs). The TxPIC chips include multiple signal channels of different wavelengths which approximate a standardized wavelength grid, such as the ITU grid, and the number of channels on any one PIC chip may range, for example, from 8 channels to 40 channels. Each chip, therefore, includes a plurality of signal channels or optical channel paths with each path comprising a DFB or DBR laser source followed by and electro-optic (EO) modulator, such as an electro-absorption (EA) modulator or a Mach-Zehnder (M-Z) modulator and, possibly, followed by an optional semiconductor optical amplifier (SOA) and/or photodetector (PD), such as a PIN photodiode or an avalanche photodiode (APD). The modulated optical signals from the multiple channel paths are launched into an optical combiner, having inputs optically coupled with each of the channel paths. The optical combiner is preferably a wavelength-selective optical combiner, such as, an Echelle grating or an array waveguide array (AWG). However, it may also be a power combiner, such as a star coupler or an multi-mode interference (MMI) coupler. An AWG type of optical combiner is preferred because of its low insertion losses. The multiplex channel signals are, then, passed, via an on-chip output waveguide from the optical combiner, to an exit port on the chip where the multiplexed channel output is optically coupled to a fiber transmission link. The output waveguide may also include a mode converter. Further details relating to this type of TxPIC architecture can be found in U.S. patent application Ser. No. 10/267,331; Ser. No. 10/267,330; and Ser. No. 10/267,346, all filed on Oct. 8, 2002, which patent applications are incorporated herein by their reference.

In the deployment of multiple TxPIC chips at the optical communication module level, it is necessary to optically combine the outputs from multiple TxPIC chips for launching them on a fiber transmission link. In order to perform this function, it has been proposed that in order to effectively accomplish this function to employ wavelength-selective multiplexing components that comprise a plurality of four-port interleavers and band combining dichroic filters to combine the multiplexed outputs of multiple TxPIC chips. These components, while presently available, are highly expensive and also suffer from high yield issues due to their complexity and newness in development and deployment.

SUMMARY OF THE INVENTION

According to one feature of this invention, an optical communication system comprises at least one monolithic semiconductor photonic integrated circuit chip having a plurality of communication signal channels formed on the chip, each of the signal channels including at least one active optical component optically coupled with a means to either optically combine or decombine channel signals on the semiconductor chip. A booster optical amplifier is optically coupled to a port on the chip to amplify channel signals to be received into or transmitted out of the chip. The booster optical amplifier can be a low performance fiber amplifier, such as, for example, an EDFA, or a semiconductor optical amplifier (SOA), semiconductor laser amplifier, a gain-clamped-SOA or concatenated amplifiers of any of the foregoing types of semiconductor optical amplifiers. One particular example of a PIC chip utilizing such a booster optical amplifier is a semiconductor monolithic transmitter photonic integrated circuit (TxPIC) chip. The booster optical amplifier is used instead of deploying semiconductor optical amplifiers directly integrated on the TxPIC chip to provide required gain for generated on-chip channel signals. By eliminating these integrated gain components fro the PIC chip, the complexity of the PIC chip can be reduced, which translates into less on-chip contacts and less applied current and bias necessary to the chip and, correspondingly, lower on-chip heat generation that must be dissipated.

A further feature of this invention is the method of deploying a passive optical combiner that is a broad bandwidth spectral wavelength combiner for combining the outputs from multiples transmitter photonic integrated circuit (TxPIC) chips and, thereafter, the amplification of the combined channel signals with a booster optical amplifier couple between the passive optical combiner and the fiber transmission link. The booster optical amplifier may be a rear earth fiber amplifier, such as an erbium doped fiber amplifier (EDFA), or one or more semiconductor optical amplifiers (SOAs) on one or more semiconductor chips. Such a combination of optical components simplifies the design of individual TxPICs and other such optical communication PICs, which has to take into consideration the nonlinear effects of difficult, high loss single mode fiber (SMF) links or other fiber-type links by allowing a higher power per channel to be achieved compared to the case where channel amplification is attempted directly on the TxPIC chip through the deployment of on-chip optical amplifiers, such as semiconductor optical amplifiers (SOAs), integrated in locations following the electro-optic (EO) modulators, if not integrated also at other locations on the same chip.

By removing the channel signal amplification requirement from the TxPIC chip, the TxPIC design and the amplification required components is simplified in several ways. First, the on-chip active optical components is reduced to the arrays of lasers sources and EO modulators (and possibly at least one array of photodetectors) as well as the passive optical combiner, thereby lowering on-chip power consumption by as much as 40% and, correspondingly, the amount of on-chip heat generated that must be carried away off-chip. Second, the number of required on-chip contacts is reduced. Third, the possible optical and/or thermal interactions of on-chip optical amplifiers with other on-chip active optical components, such the laser sources and the EO modulators, are eliminated. Fourth, two-photon absorption (TPA) possibly occurring in the optical combiner is significantly reduced if not eliminated. Fifth, the launch power per channel is set by the booster optical amplifier rather than via any on-chip semiconductor amplifiers so that the total launch power for all channels can be adjusted to meet the different loss requirements of different high loss, single mode fiber (SMF) optical spans or links. Sixth, on-chip SOAs in each channel path can degrade the extinction ratio of the EO modulators. As a result, operation of the SOAs would have to be sufficiently backed off of saturation to prevent such degradation, which may be several dB, which defeats, in part, the purpose of providing on-chip amplifiers. Seventh, with no on-chip semiconductor optical amplifiers, any negative impact of ASE noise feedback from such on-chip amplifiers back into on-chip electro-optic modulators is eliminated. Such ASE feedback would significantly affect the extinction ratio of the modulators.

A further advantage of the deployment of a low cost, low performance booster optical amplifier at the output of a TxPIC semiconductor chip is that the amplifier, such as in the case of an EDFA, need not be a high performance, expensive optical amplifier and, therefore, providing a significantly cost-effective approach for achieving desired gain per channel. In this regard, the EDFA may be a single stage EDFA with one pump laser where the amplifier stage is only a few meters long. This compares to a high performance amplifier that has multiple stages and two or more pump lasers and is many meters long, such as the type deployed for mid-span optical amplification.

Also, in the case of multiple PIC chip outputs combined via an optical combiner, such as a power coupler or a star coupler, the deployment of an relatively inexpensive optical amplifier at the optical combiner output permits the use of a less expensive optical combiner, as opposed to an interleaver or multiplexer, which couplers have no wavelength selective passband effect or guardbands but do experience higher optical losses. Thus, an inexpensive optical amplifier following such a broad bandwidth spectral wavelength combiner complements the higher insertion loss of such a combiner with sufficient per channel gain eliminating the need for a more expensive band interleaver or multiplexer having passband selective effects although providing comparatively lower optical losses.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DETAILED DESCRIPTION OF THE INVENTION

Figure 1:
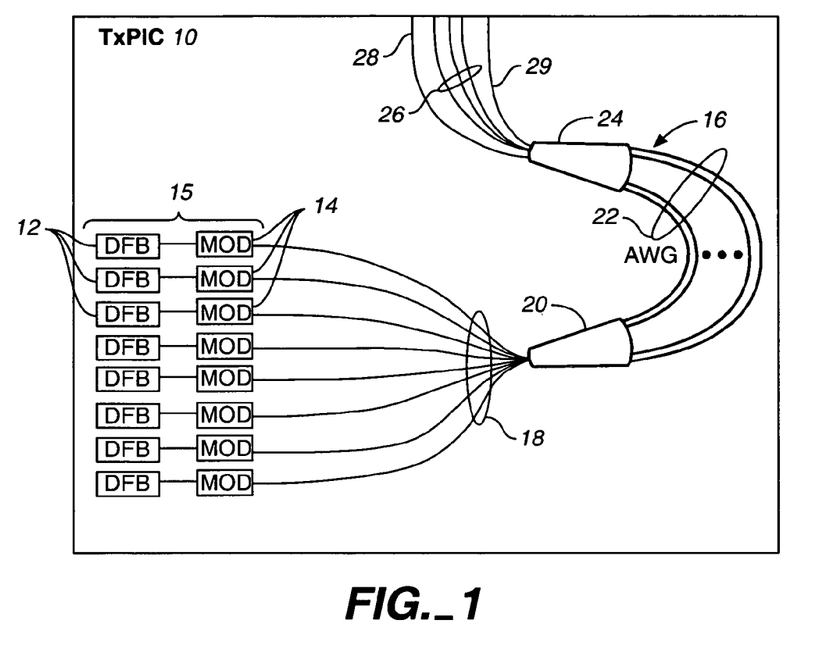
FIG. 1 is a schematic plan view of an example of a PIC chip, to wit, a TxPIC chip, that may be utilized in the practice of this invention.
Figure 3:
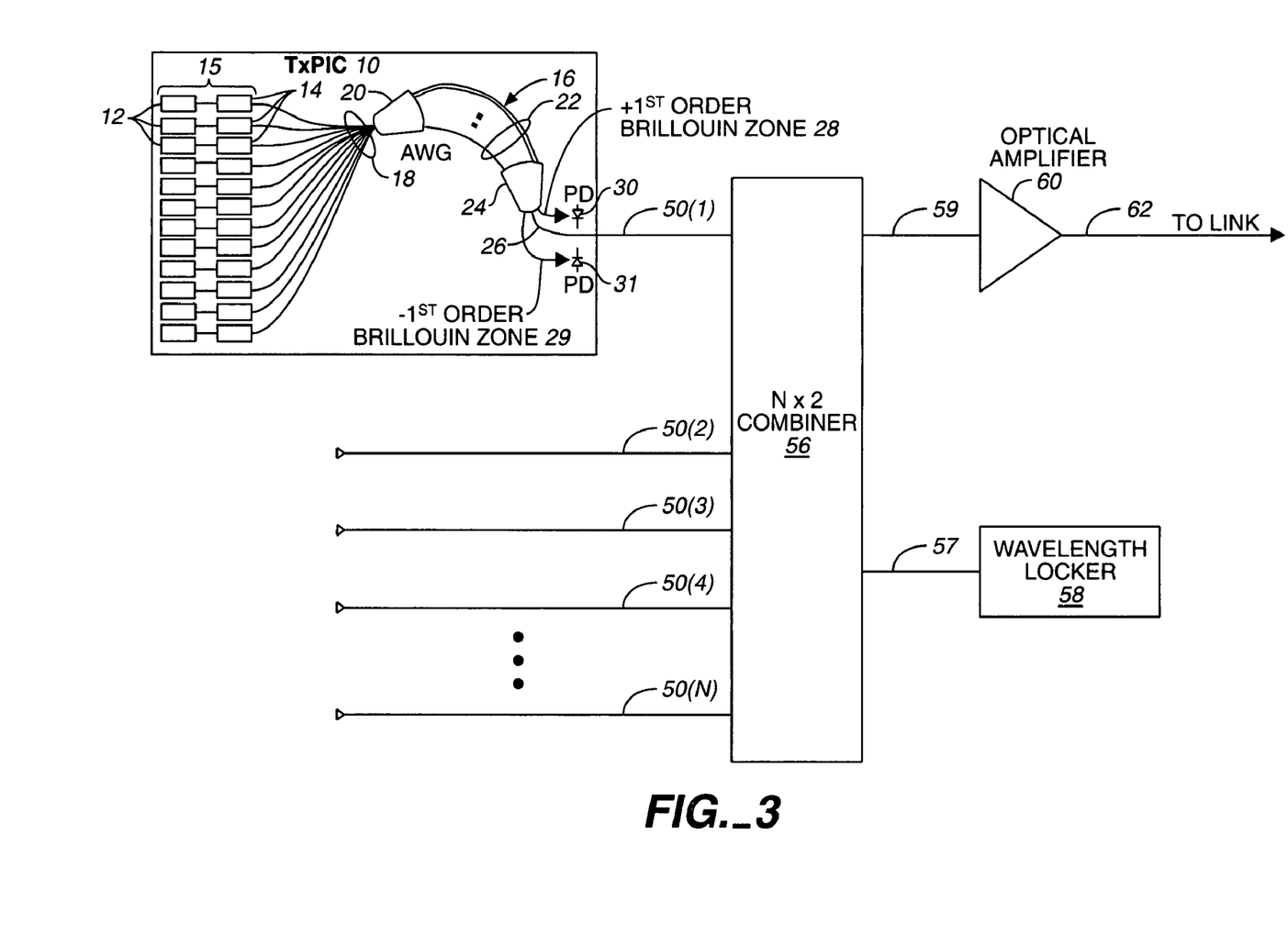
FIG. 3 illustrates a first embodiment of this invention.

Reference is first made to FIG. 1 illustrating an embodiment of TxPIC chip 10 for the purpose of later illustrating such a chip or chips in the embodiments of this invention. Semiconductor chip 10 comprises an array of DFB or DBR lasers 12 and array of electro-optic (EO) modulators 14, such as electro-absorption modulators or Mach-Zehnder modulators, optically coupled via optical waveguides 18 to an optical combiner comprising an arrayed waveguide grating (AWG) 16. As an example, TxPIC 10 may have eight optical signal channels with different channel wavelengths from $\lambda_1$ to $\lambda_8$ forming a wavelength grid substantially matching that of a standardized wavelength grid, such as the ITU grid. However, the number of signal channels may be less than or greater than eight channels, the latter depending upon the ability to spatially integrate an array of semiconductor modulator/lasers (SMLs) 15, i.e., sets 15 comprising a laser source 12 and modulator 14, while achieving minimal cross-talk levels. AWG 16 is an optical combiner of choice because of its capability of providing narrow passbands for the respective channel signals, i.e., it is wavelength selective, and provides for optimum low insertion loss. AWG 16, as known in the art, comprises an input slab or free space region 20, a plurality of grating arms 22 of predetermined increasing length, $\Delta L$, and an output slab or free space region 24. The orientation of the active components of TxPIC chip 10 is such that both the laser and modulator arrays are at 90° C. relative to the output waveguides 26 of AWG 16. This PIC architecture optimally minimizes the amount of unguided stray light generated from the SML sets 15 that becomes captured by the AWG output waveguides 26 and, therefore, does not appear as noise on the multiplexed channels signals thereby improving the extinction ratio of the outgoing multiplexed signals on any one of the waveguides 26. Multiple waveguides 26 provide a vernier from which the best overall output in terms of wavelength grid and power can be chosen from AWG 16. The extinction ratio loss from this stray light may be as much 1 dB. Wavelength selective combiner 16 may also be an Echelle grating or may be a non-selective wavelength type, such as a power combiner 17, shown later in FIG. 4. Additional output waveguides 28 and 29 may be provided at higher order Brillouin zones of AWG output slab 24 to couple the higher order Brillouin zone power to photodetectors 30 and 31 as seen in FIG. 3. Photodetectors 30 and 31 may be off-chip integrated photodetectors or may be on-chip photodetectors as shown in FIG. 3. Photodetectors may be PIN photodiodes or avalanche photodiodes (APDs).

As shown in FIG. 3, PIN photodiodes 30 and 31 are fabricated in the higher order +/−Brillouin zones, e.g., the −1 and +1 Brillouin zones 28 and 29 of AWG output slab 24. The two photodiodes 30 and 31 are so positioned to detect on opposite sides of the AWG passband. Each laser source 12 may be dithered at an identical low frequency or at different low frequencies so that each source can be individually identified. A laser 12 is aligned to the AWG passband when its wavelength is tuned such that the two photodiodes 30 and 31 have a balanced AC output, i.e., outputs of the same magnitude. More generally, a balanced ratio between these photodiodes 30 and 31 can be deployed as a setpoint for a reference. As just indicated above, for the purposes of making this passband test for each laser source 12 on TxPIC chip 10, the lasers may be each dithered sequentially, one at the time, at the same tone frequency, or concurrently at different tone frequencies.

Figure 2:
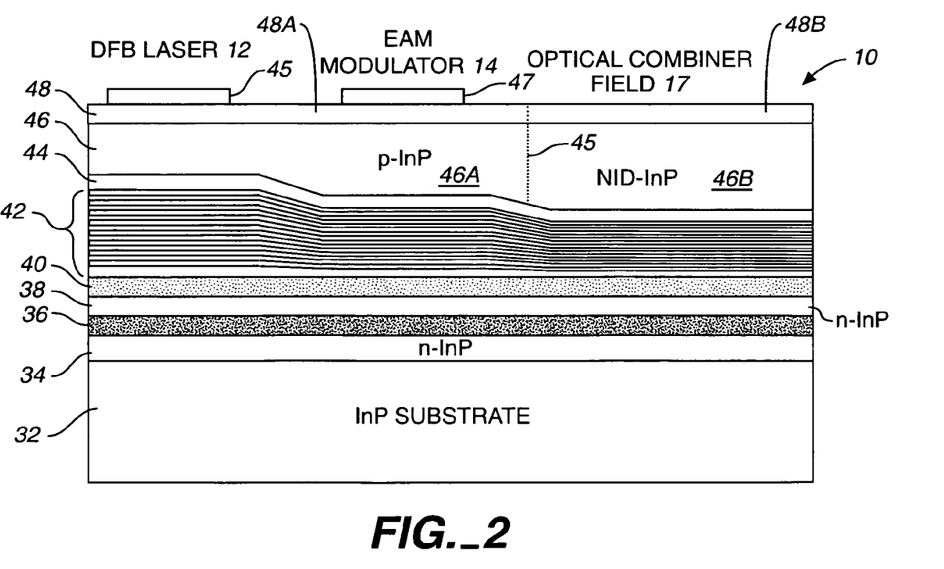
FIG. 2 is a schematic side view of the TxPIC shown in FIG. 1.
Figure 4:
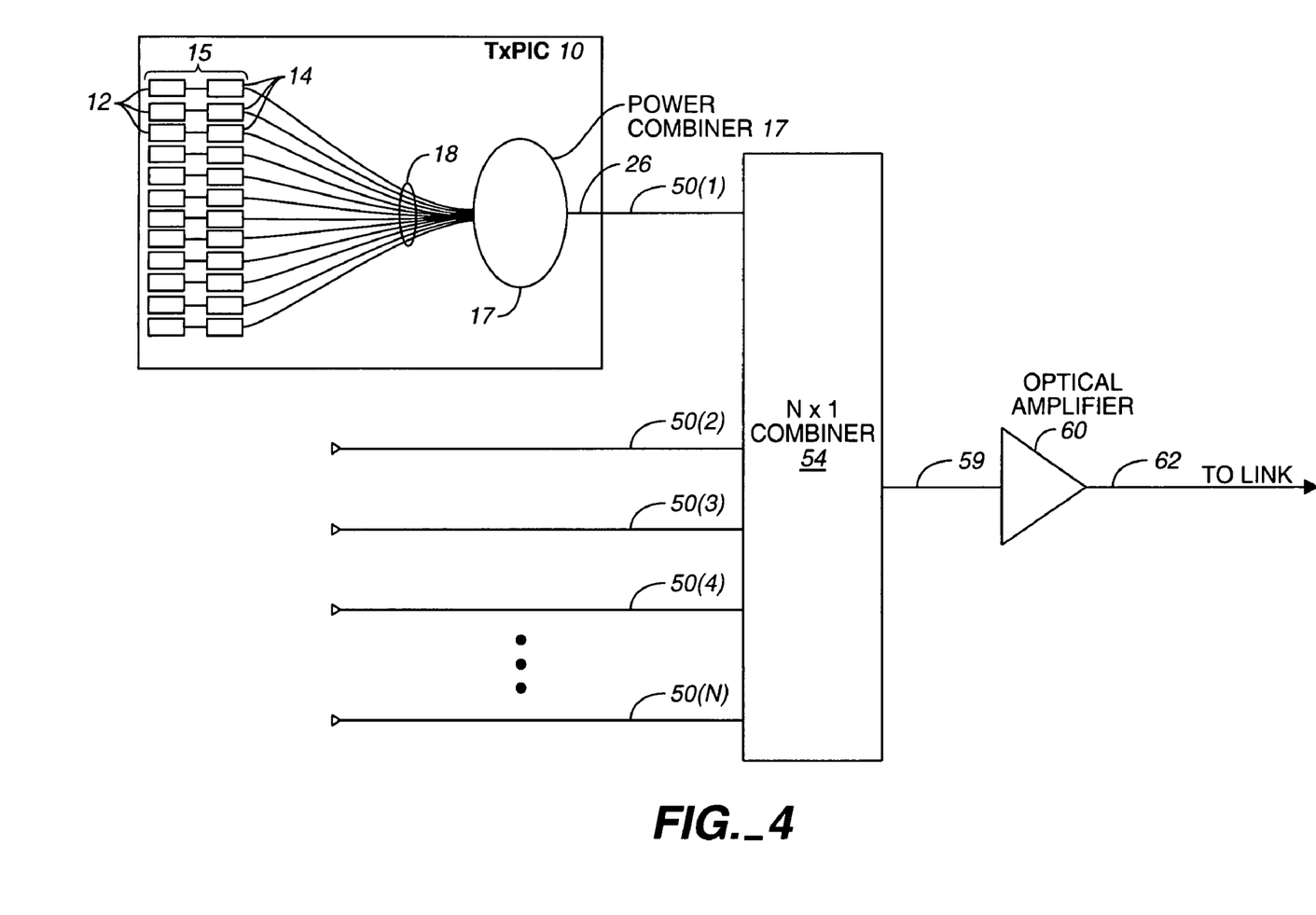
FIG. 4 illustrates a second embodiment of this invention.

Reference is now made to FIG. 2 which is a cross-sectional view of an optical channel path in TxPIC chip 10. It should be noted that FIG. 4 is not drawn to scale, particularly with respective to active region 42, which is enlarged, and is presented in this manner to help explain the structure. As seen in the cross-sectional view of FIG. 2, there is illustrated a single optical SML path plus optical combiner field of TxPIC chip 10. Chip 10 comprises an InP substrate 32, such as n-InP or InP:Fe, followed by a cladding layer 34, a Q waveguide layer 36, a spacer layer 38 of n-InP, followed by grating layer 40. Grating layer 40 includes a grating (not shown) in the section comprising, in the case here, a DFB laser 12, having a periodicity that provides a peak wavelength at or near the peak wavelength on a standardized wavelength grid. Grating layer 40 is followed by layer 41 of n-InP and multiple quantum well region 42 of quantum wells and barriers employing a Group III–V quaternary (Q) such as InGaAsP or AlInGaAs. These quaternaries are collectively referred to as "Q". These Q layers are deposited deploying SAG using a mask to form the individual DFB bandgaps of their active regions as well as the bandgaps for the individual modulators 14 so that wavelengths generated by the DFB laser 12 will be transparent to the individual modulators 14. Also, the wavelength of the field of optical combiner 17 will be shorter than that of the modulators 14. As an example, the longest bandgap wavelength for an array DFB laser may be 1590 nm, its modulator, such as a semiconductor electro-absorption modulator (EAM), may have a bandgap wavelength of 1520 nm and the field of optical combiner 17 may have a bandgap wavelength of 1360 nm.

The Q active region 42 and the Q waveguide core 36 layer extend through all of the integrated optical components. If desired, DFB lasers 12 can be composed of a different active layer structure than the region of the EAMs 14. In this embodiment, the Q waveguiding layer 36 provides most of the optical confinement and guiding through each optical component section of TxPIC chip 10.

The chip 10 is completed with the growth of non-intentionally doped (NID) InP layer 44 and cladding layer 46, which is n-InP over the active components 12 and 14 and NID-InP over optical combiner 17, followed by contact layer 48A comprising $p^{++}$-InGaAs over active components 12 and 14 and a passivation layer 48B over the optical combiner field 17. Cladding layer 46 as well as its overlying contact layer portion is selectively etch away either over the SMLs or over the field of optical combiner 17 and regrown so that a partition, schematically illustrated at 45, results comprising p-InP portion 46A and $p^{++}$-InGaAs layer 48A in regions of DFB lasers 12 and EAMs 14 and a NID-InP layer 46B and a passivation layer 48B in region of the field of optical combiner 17. The passivation layer 48B may be BCB. The reason for this etch and regrowth is to render the optical combiner field 17 non-absorbing to the optical channel signals propagating thought this optical passive device. More is said and disclosed relative to this matter in U.S. application Ser. No. 10/267,346, incorporated herein by its reference.

Chip 10 is completed with appropriate contact pads or electrodes, the p-side electrodes 45 and 47 shown, respectively, for DFB laser 12 and EAM 14. If substrate 32 is semiconductive, i.e., n-InP, then an n-side electrode (not shown) is provided on the bottom substrate 32. If substrate 32 is insulating, e.g., InP:Fe, the electrical contact to the n-side is provided through a via (not shown) from the top of the chip down to n-InP layer 34. The use of a semi-insulating substrate 32 provides the advantage of minimizing electrical cross-talk between the integrated optical components, particularly active electrical components in aligned arrays, such as DFB lasers 12 and EAMs 14. The inter-component spacing between adjacent DFB laser 12 and EAMs 14 may be about 250 μm or more to minimize cross-talk at data rates of 10 Gbits per sec.

Reference is now made to FIG. 3 which illustrates a plurality of TxPICs 10 of FIG. 1 with their output waveguides 26 coupled to the respective inputs 50(1) ... 50(N) of a N×2 optical combiner 56 which is, in turn, coupled to a single booster optical amplifier 60. It is important to note that while multiple TxPIC chips 10 of FIG. 1 or other such PIC chip are illustrated in these and other figures, the invention herein described is equally applicable to a single TxPIC chip 10 with its output coupled to a booster optical amplifier 60 to provide gain to the multiplexed signal from output waveguide 26 of the chip. FIG. 3 illustrates multiple TxPIC chips 10 because the low performance, booster amplifier 60 is capable of providing gain to more than just the wavelength grid channels of a single PIC chip 10.

In FIG. 3, only one of the TxPICs 10 is shown in detail. Each of the TxPICs 10 has a different group or band of multiplexed channel wavelengths within a standardized grid which are then all combined together via N×2 optical combiner 56. Optical combiner 56 has two outputs 57 and 59 to allow an extra port for wavelength locking of the multiple laser signal sources in one or multiple TxPIC chips 10. It should be noted that more than two optical combiner outputs may be provided or utilized for the purposes of providing a feedback to a wavelength control system for wavelength monitoring and wavelength locking one or more TxPIC chips 10 independently of one another. This extra optical combiner output port 57 will not affect the insertion loss of the optical combiner. Output 57 provides a small portion (such as 1% to 3%) of the multiplexed groups of output channel signals to wavelength locker 58. The additional output port 57 is coupled to a wavelength locker 58 to monitor the TxPIC channel signals and provide feedback to maintain operational wavelengths of their laser sources 12 within the standardized wavelength grid. For more detail as to wavelength lockers, see U.S. patent application Ser. Nos. 10/267,330 and 10/267,331, incorporated herein by reference. Locker 58 provides information of the wavelength position of each of the laser sources 12 relative to its desired operational wavelength on a standardized grid and provides feedback to laser sources 12 of the respective PIC chips 10 to adjust their operating wavelengths to be more approximate to or as close as possible within the desired tolerance of the grid wavelengths for each laser source 12. This adjustment can be made either by adjusting the current or bias of the laser source or by adjusting the current or bias to local heaters approximate to each laser source 12, or the application of both, as taught in the previously incorporated patent applications.

Likewise, an extra output port which contains all channels can be transmitted on a second fiber in a 1+1 protection scenario. This would be especially valuable in a fiber ring protection, where duplicates of all channel signals are simultaneously sent clockwise and counterclockwise from each terminal point within a fiber ring.

Output 59 provides the multiplexed groups of output channel signals from combiner 56 to a comparatively lower performance optical amplifier 60 providing gain spectrally across the multiplexed signals prior to launching the same, via fiber 62, onto a fiber link or span. Optical amplifier 60 may be any amplifier capable of amplifying across the spectral band width of all of the multiplexed signals present on line 59. Examples of amplifiers 60 are rare earth fiber amplifiers and semiconductor optical amplifiers (SOAs). The preferred embodiments are an erbium doped fiber amplifier (EDFA), or a group of SOAs or concatenated SOAs which provide sufficient output power to provide an adequate gain level to the multiplexed signals on line 59. In particular, the SOAs may be comprised of one or more laser amplifiers, such as one or more gain clamped-SOAs. The advantage of these types of SOA devices is that they are small and compact compared with fiber amplifiers. For higher gain requirements, plural SOAs can be concatenated in line 59. The type of EDFA deployed need no be a high performance EDFA, i.e., it need not be multiple stage or have multiple laser pumps as in the case of a mid-span, bidirectional EDFA system comprising several such fiber amplifiers and multiple laser pumps. The low cost EDFA may include a few meters of active rare earth doped fiber and a single laser pump. An advantage of deploying such an optical amplifier 60 is that a lower cost optical combiner may be deployed at 56 rather than deploying a more expensive wavelength selective multiplexer or interleaver with bandguards. While the insertion loss of optical combiner 56 is higher, the low performance, inexpensive optical amplifier 60 provides sufficient gain to properly complement the multiplexed signals on line 59 to compensate for such high optical insertion losses and provide the multiplexed signals with sufficient gain for launching on an optical transport network.

Another advantage of deploying optical amplifier 60 is to eliminate the need for integrated, on-chip amplification in TxPIC chips 10, such as integrated SOAs positioned between the outputs of modulators 14 and optical combiner 17 or 18. Therefore, the number of required on-chip active optical components is reduced thereby lowering on-chip power consumption by as much as 40% and, correspondingly, the amount of on-chip heat generated that must be carried away off-chip. Thus, the power and thermal budgets of TxPIC chip 10 may be lowered to more acceptable limits and the number of output pads from the chip is reduced. Also, possible optical and/or thermal interactions of on-chip optical amplifiers with other on-chip active optical components, such the laser sources and the EO modulators, are eliminated. On-chip SOAs can bring about two-photon absorption (TPA) possibly occurring in the optical combiner 17 or 18 if the optical path is sufficiently long, via the optical combiner, to permit TPA introduction. Thus, without on-chip SOA deployment, TPA need not be an issue. Also, the launch power per channel is set by the booster optical amplifier rather than via any on-chip amplifiers so that the total launch power for all channels can be adjusted to meet the different loss requirements of different high loss single mode fiber (SMF) optical spans. Finally, without the need of integrated on-chip optical amplifiers means that there will be no degradation of the modulator extinsion ratio and any ASE noise feedback if such devices are present on the chip.

As a specific example, in a typical signal channel of TxPIC chip 10, the loss/gain from laser source 12 to booster amplifier 60 may be as follows:

TABLE 1

|  | DFB Laser 12 | EA Modulator 14 | AWG 18 | Optical combiner 56 | Optical Amplifier 60 |
|---|---|---|---|---|---|
| Gain/Loss | – | 11 dB | 6 dB | 11 dB | |
| Accumulated Loss | +3 dBm | −8 dBm | −14 dBm | −25 dBm | −2 dBm/ch |

The power figures shown in Table 1 are the power per channel for the worst case channel after signal passage via each optical component in an optical channel path through chip 10, optical combiner 56 and booster optical amplifier 60.

As indicated above, two primary advantages of eliminating on-chip semiconductor amplifiers, such as SOAs, on TxPIC chip 10 are the simplification of the overall PIC structure and the reduced heat load present on the multi-channel PIC chip. As an example, if a twelve-channel TxPIC is assumed and a value of 200 mA is driving each in-line SOA in each of the twelve channel paths on the chip, the elimination of the PIC SOAs eliminates approximately 2.4 A of total drive current on the PIC module, which is a large source of heat on the chip.

Also, as indicated above, the elimination of on-chip optical amplifiers eliminates any two-photon absorption (TPA) effects associated with the AWG component on the TxPIC chip 10. As a specific example, instead of +8 dBm per channel amplification entering an AWG 18 with on-chip channel amplification, the value entering the AWG is −8 dBm per channel. TPA in the AWG has been shown to occur and will probably limit the power per channel that can be launched into an optical span or fiber link. Likewise, the output power of an on-chip SOA and the proper choice of operating point on the gain saturation curve will limit the power per channel to a value of about −2.5 dBm. As indicated previously, an on-chip optical amplifier operating point sufficiently removed from gain saturation is necessary to insure that the extinction ratio of the EO modulator is not degraded.

As just mentioned above, the launched power per channel may be currently limited to approximately −2.5 dBm/channel, which arises from limitations in the properties of the on-chip booster SOAs (saturation power and gain shape) and nonlinear effects in AWG 18. More latitude is desired in launched channel powers for addressing different types of single mode fiber (SMF) links. It is feasible that per channel powers of 0 dBm will be desired to adequately address 25 dB loss, or higher, spans of SMF. Thus, the launch power per channel can be set by booster optical amplifier 60 which is not limited in launched power and overcomes the loss problems of current SMF links. The higher dispersion and larger effective area of SMF fiber, and perhaps E-LEAF fiber, will allow higher per channel powers to be launched. A higher power booster amplifier could be used for SMF links while a lower power booster amplifier could be used for NZDSF types of fibers.

As previously indicated, the deployment of optical combiner 56 in this invention has several advantages. There will be no passband issues associated with highly selective multiplexing elements such as interleavers. There will also be no multiplexer elements, such as red/blue dichroic filters, that have guard bands and, hence, the passive optical combiner elements will lead to the highest spectral efficiency within any gain band. The extra input ports (until full semiconductor PIC chip population is reached in a transmitter communication module) may be used for sparing, hot swapping, or protection.

Reference is now made to FIG. 4, which is much the same as FIG. 3 except that an N×1 optical combiner 54 is shown in place of N×2 optical combiner 56 in FIG. 3, and also a power combiner 17 of the broad bandwidth spectral wavelength type is shown in the architecture of TxPIC chip 10 instead of a wavelength selective combiner 18. Optical combiner 17, for example, may be a star coupler or a MMI coupler. In the case here, power combiner 17 brings about more insertion loss than a wavelength selective type of combiner 18 so that the deployment of an off-chip booster optical amplifier 60 becomes a more important factor whether there is a single TxPIC chip 10 or multiple TxPIC chips 10. The advantage of this approach is principally two-fold in that a less expensive TxPIC chip 10 can be deployed, which is less expensive since a more complex fabricated, wavelength selective multiplexer 18 is substituted with a lower cost optical combiner 17 with higher insertion losses which can be compensated for with a low cost, low performance off-chip booster optical amplifier 60. Third, a low cost optical combiner 54 can be deployed having higher losses than a wavelength-selective type multiplexer for combining several outputs 50 from multiple TxPIC chips 10.

Figure 5A:
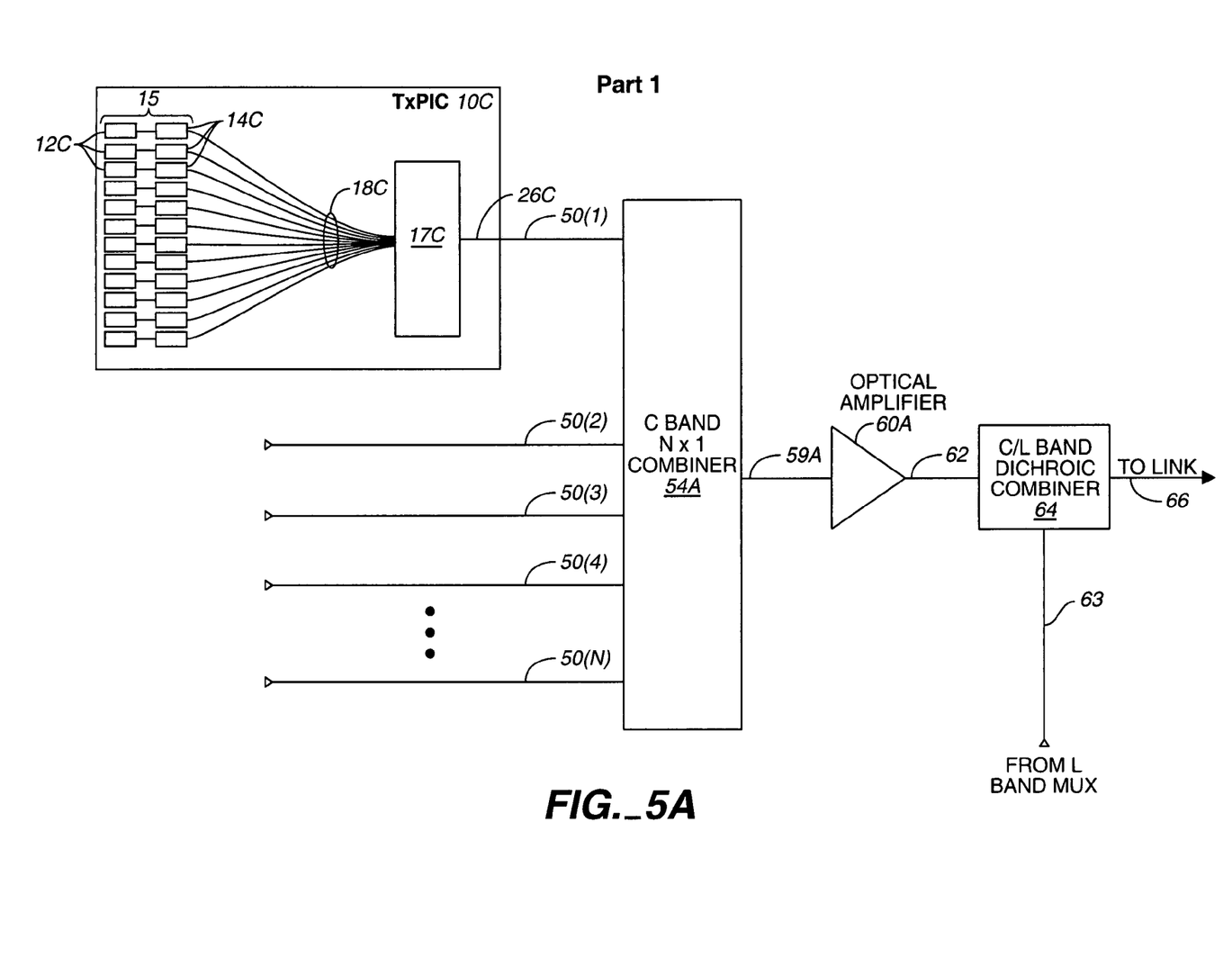
FIG. 5A (Part 1) and 5B (Part 2) illustrate a third embodiment of this invention relative to transmission in the C and L bands.
Figure 5B:
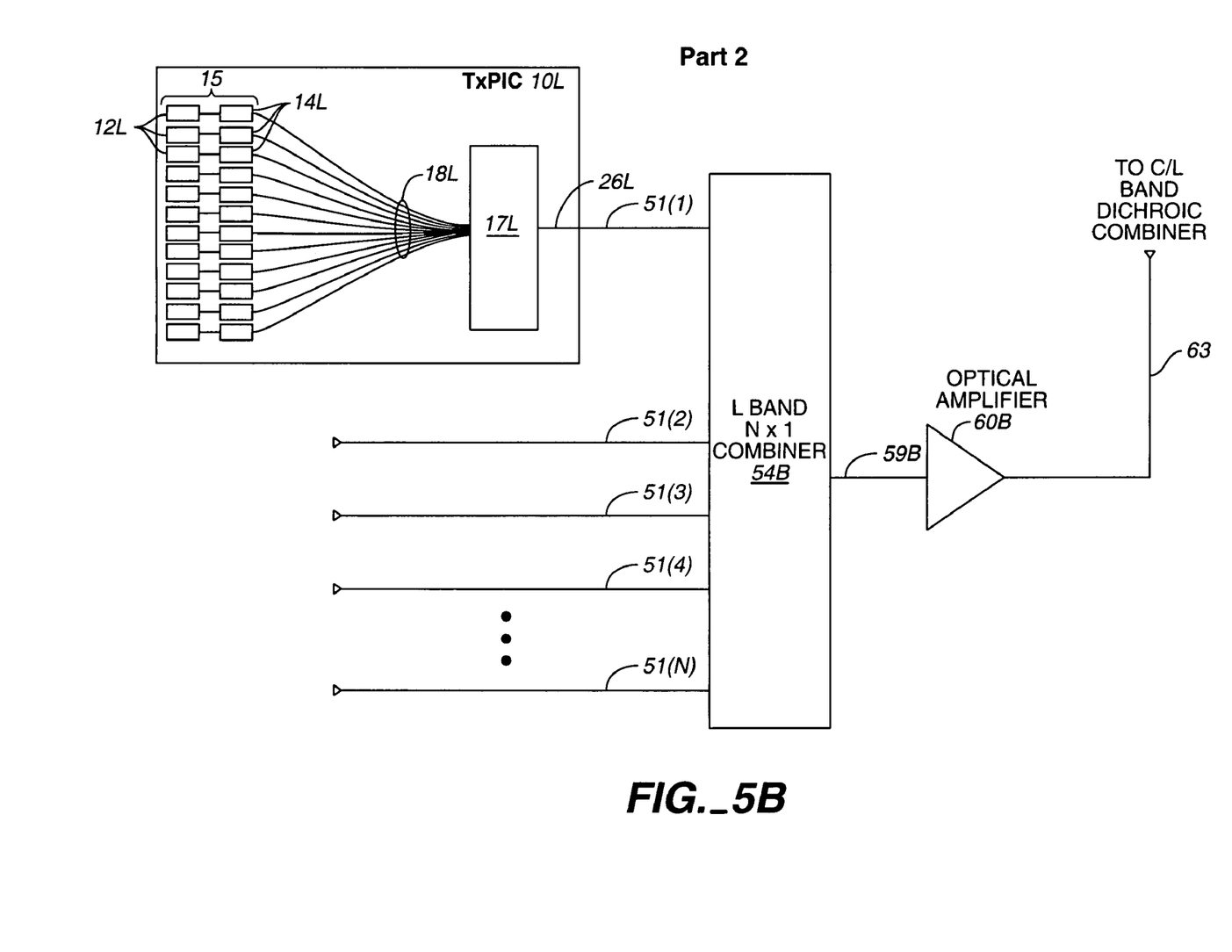

Reference is now made to FIG. 5 comprising Parts 1 and 2 (FIGS. 5A and 5B respectively). FIG. 5 is similar to FIG. 4 except that there are shown two spectral groups of TxPIC chips 10 respectively operating in the C and L bands of wavelength channels. It is within the scope of this invention to operate in other bands that can be gain-covered by booster optical amplifiers 60, such as the S-band. In the C band, as shown in FIG. 5A, chips 10C each have laser sources 12C with operational wavelengths within the C band and corresponding integrated optical components comprising EO modulators 14C, coupling waveguides 18C, optical combiner 17C and output waveguide 26C. In the L band, as shown in FIG 5B, chips IOL each have laser sources 12L with operational wavelengths within the L band and corresponding integrated optical components comprising EO modulators 14L, coupling waveguides 18L, optical combiner 17L and output waveguide 26L. Combiners 17C and 17L may be a power combiner, such as a star coupler or an MMI coupler, or may be a wavelength selective combiner 18, such as an Echelle grating or an AWG. The outputs from each TxPIC chip 10 in the C or L band are combined via optical combiner 54A or 54B, respectively, and their respective outputs are placed on lines 59A and 59B respectively to C-band and L-band booster optical amplifiers 60A and 60B, which amplifiers may also be C+L booster optical amplifiers. The amplified C and L band signals are then combined by C/L dichroic combiner 64 for placement on fiber 66 to be launched on the optical link or span.

Thus, in general, the deployment of optical passive combiner 54 or 56 in combination with booster optical amplifiers 60 shifts the procurement emphasis away from the presently immature and costly wavelength selective types of multiplexers, such as multi-port interleavers and custom red/blue dichroic filters, and toward procurement of mature, high-volume, low cost EDFA components and low cost optical passive combiners that are not wavelength selective but are lass expensive, broad bandwidth spectral power combiners. These are important features of this invention.

While the invention has been described in conjunction with several specific embodiments, it is evident to those skilled in the art that many further alternatives, modifications and variations will be apparent in light of the foregoing description. For example, a TxPIC chip 10 has been the exemplary example in the description of the application if this invention. However, such an optical amplifier 60 can also be deployed at the input of a semiconductor monolithic receiver photonic integrated circuit (RxPIC) chip of the type disclosed in U.S. patent application Ser. No. 10/267,304, which application is incorporated herein by its reference. By deploying such an amplifier with such an optical receiver semiconductor chip, the use of on-chip amplifiers, such as SOAs or semiconductor laser amplifiers, such as gain-clamped-semiconductor optical amplifier (GC-SOAs), is not necessary which has the general advantages as already pointed out herein relative to the TxPIC chip example. Thus, the invention described herein is intended to embrace all such alternatives, modifications, applications and variations as may fall within the spirit and scope of the appended claims.

The invention claimed is:

1. A method of providing a semiconductor transmitter photonic integrated circuit (TxPIC) chip comprising the steps of:

fabricating a monolithic semiconductor transmitter photonic integrated circuit (TxPIC) chip having a plurality of modulated wavelength sources having different wavelengths approximating a standardized grid of wavelengths with their respective modulated signal outputs optically combined with an integrated optical combiner to provide a combined signal output;

eliminating from the fabricating step the integration of any on-chip amplification for the modulated signal outputs or the combined signal output; and coupling the combined signal output, instead, into an off-chip booster optical fiber amplifier at an output of the chip prior to launching the combined signal output on an optical link so that the absence of on-chip amplification on the TxPIC chip reduces chip complexity by eliminating active on-chip amplifiers and reduces resultant power consumption and heat load on the TxPIC chip due to the elimination of the requirement for current bias to operate such active on-chip amplifiers.

2. The method of claim 1 wherein the booster optical fiber amplifier is a rare fiber amplifier.

3. The method of claim 1 wherein the booster optical fiber amplifier is a single stage erbium doped fiber amplifier (EDFA) pumped by a pump laser.

4. The method of claim 1 further comprising the steps of:

combining the signal outputs of a plurality of monolithic semiconductor transmitter photonic integrated circuit (TxPIC) chips through a broad bandwidth spectral power combiner and coupling the combined output from the broad bandwidth spectral power combiner to the booster optical fiber amplifier comprising is a single stage erbium doped fiber amplifier (EDFA) so that any requirement for a wavelength-selective combiner for accomplishing this step is not necessary.

5. The method of claim 4 wherein said broad bandwidth spectral wavelength combiner is a multi-mode interference (MMI) coupler or a stir coupler.

6. A method of providing a semiconductor transmitter photonic integrated circuit (TxPIC) chip comprising the steps of:

deploying at least one monolithic semiconductor transmitter photonic integrated circuit (TxPIC) chip having a plurality of modulated sources having different wavelengths and producing a plurality of respective modulated signal outputs of different wavelengths;

deploying an integrated broad bandwidth spectral wavelength combiner on the TxPIC chip to combine the plurality of signal outputs into a single signal output;

eliminating any deployment of on-chip amplification on the TxPIC chip of the modulated signal outputs or the single signal output; and coupling the single signal output into an off-chip booster optical amplifier at an output of the TxPIC chip prior to launching the combined signal output on an optical link thereby reducing chip complexity by eliminating active on-chip amplifiers as well as reducing resultant power consumption and heat load on the TxPIC chip due to the elimination of the requirement for current bias to operate such active on-chip amplifiers.

7. The method of claim 6 wherein said booster optical amplifier is an optical fiber amplifier on a semiconductor optical amplifier (SOA).

8. The method of claim 6 wherein said booster optical amplifier is an erbium doped fiber amplifier.

9. The method of claim 6 wherein said broad bandwidth spectral wavelength combiner is a multi-mode interference (MMI) coupler or a star coupler.

* * * * *